United States Patent [19]

Sani et al.

[11] Patent Number: 4,656,372

[45] Date of Patent: Apr. 7, 1987

[54] CMOS TO ECL INTERFACE CIRCUIT

[75] Inventors: Mehdi H. Sani, La Jolla; Donald G. Tipon, San Diego, both of Calif.

[73] Assignee: NCR Corporation, Dayton, Ohio

[21] Appl. No.: 801,548

[22] Filed: Nov. 25, 1985

[51] Int. Cl.[4] .................. H03K 19/092; H03K 19/094; H03K 19/20; G06F 7/38

[52] U.S. Cl. .................................... 307/475; 307/451; 307/469

[58] Field of Search ............... 307/475, 446, 443, 451, 307/264, 469

[56] References Cited

U.S. PATENT DOCUMENTS

| | | | |
|---|---|---|---|
| 4,122,360 | 10/1978 | Kawagai et al. | 307/270 |
| 4,578,600 | 3/1986 | Magee | 307/270 |

FOREIGN PATENT DOCUMENTS

| | | | |
|---|---|---|---|
| 2373921 | 8/1978 | European Pat. Off. | 307/475 |
| 0227843 | 9/1985 | Fed. Rep. of Germany | 307/475 |
| 0083421 | 5/1985 | Japan | 307/475 |

Primary Examiner—Stanley D. Miller
Assistant Examiner—M. R. Wambach
Attorney, Agent, or Firm—Wilbert Hawk, Jr.; Edward Dugas

[57] ABSTRACT

The circuits of the present invention convert CMOS logic levels to corresponding ECL logic levels to permit the coupling of CMOS and ECL circuits. One preferred circuit embodiment is comprised of three p-channel transistors and one n-channel transistor. The first p-transistor has its source connected to a reference potential, such as ground, and its drain electrode connected to the source of the second p-transistor. The drain and the gate of the second p-transistor are connected together to an output terminal. The drain of the third p-transistor is connected to the output terminal. The gate and the source of the third p-transistor are connected to the drain of the n-transistor. The source of the n-transistor is connected to a CMOS compatible potential source. The CMOS logic level signal is coupled to the gate of the first p-transistor and the gate of the n-transistor. The output terminal is connected to an ECL compatible potential source via a termination resistor. Two other circuit embodiments are disclosed which provide for non-inverted and inverted outputs.

3 Claims, 3 Drawing Figures

CMOS TO ECL INTERFACE CIRCUIT

BACKGROUND OF THE INVENTION

The subject matter of the present invention relates to circuitry for converting CMOS logic levels to corresponding ECL logic levels to permit the coupling of CMOS circuits to ECL circuits.

To couple a CMOS circuit to an ECL circuit the difference between the output voltages from the one circuit and the input voltages needed by the second circuit must be generated by some form of interfacing circuit. A CMOS circuit's logic level "1" will approach the power supply value, generally 3 volts, while its logic level "0" will be near the reference or ground level. On the other hand, an ECL circuit's logic level "0" will approach −1.8 V, while its logic level "1" will approach −0.88 volts.

Circuitry for performing an interfacing function should contain only a few transistors in order to minimize the use of silicon area and to minimize propagation delays through the transistors.

A patent of interest is U.S. Pat. No. 4,486,671, entitled "Voltage Level Shifting Circuit", by Daniel Ong. The circuit described in that patent is a voltage level shifting circuit that is suitable as an interface circuit between TTL and CMOS circuitry.

Another patent of interest is U.S. Pat. No. 4,486,670, entitled "Monolithic CMOS Low Power Digital Level Shifter", by Yiu-Fai Chan et al. The circuit of that patent provides a power level shift which converts the typical transistor logic levels, for example, typically 5 volts, to a higher voltage, approximately 20 volts, in order to program an EPROM.

Another patent of interest is U.S. Pat. No. 4,453,095, entitled "ECL MOS Buffer Circuits", by R. S. Wrathall. The circuit of that patent is a buffer circuit for interfacing CMOS circuitry with associated ECL devices.

SUMMARY OF THE INVENTION

It is a principal object of the present invention to provide an improved CMOS to ECL interface circuit.

It is another object of the present invention to provide a CMOS to ECL interface circuit which requires a minimum of integrated circuit area and which uses relatively little power.

In one preferred embodiment of the circuit, there is provided an input terminal and an output terminal with the output terminal coupled to an ECL compatible power source by means of a termination load and a complementary switch for alternately connecting the output terminal between a reference potential and a CMOS compatible power source. A circuit coupled to the input terminal is responsive to CMOS logic level signals for activating the complementary switch as a direct function of the CMOS logic level signals. More specifically a circuit is provided having an input terminal and an output terminal. A termination resistor is adapted to couple a first power source to the output terminal. Also provided are first, second, fourth, fifth and sixth field effect transistors, of a first conductivity type, each having gate, source and drain electrodes, and a third field effect transistor of second conductivity type, having gate, source and drain electrodes. The input terminal is connected to the gate electrodes of the first, second, third and sixth field effect transistors. The output terminal is connected to the drain electrodes of the fourth and fifth field effect transistors and to the source electrode of the sixth field effect transistor. The source electrodes of the first, second and fifth field effect transistors are coupled to a reference potential and the source and drain electrodes of the third and sixth field effect transistors, respectively, are adapted to be coupled to a second power source. The drain, source and gate electrodes of the first, fourth and fifth field effect transistors, respectively, are coupled together and the drains of the second and third field effect transistors are coupled to the gate of the fourth field effect transistor. Two additional embodiments of the present invention are disclosed, which embodiments provide a non-inverted and an inverted output.

The aforementioned objects and features of the present invention will become more apparent when taken in conjunction with the following description and drawings wherein like characters indicate like parts and which drawings form a part of the present specification.

DESCRIPTION OF THE PREFERRED EMBODIMENT

Figure 1:
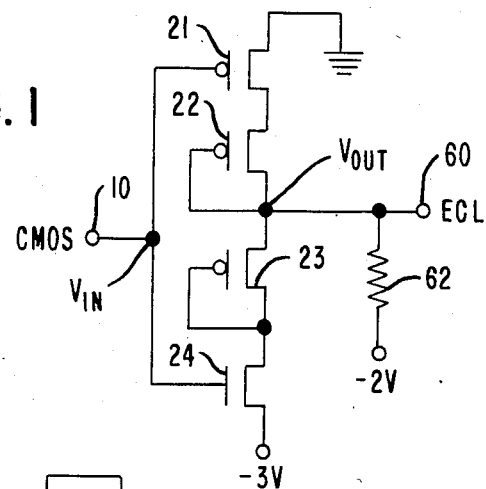
FIG. 1 is a circuit diagram of one embodiment of the invention.

Referring to FIG. 1, four field effect transistors 21, 22, 23 and 24 are connected in series by their source and drain electrodes between a reference potential (ground) and a −3 volt DC power source. In the preferred embodiment, transistors 21, 22 and 23 are p-channel types and transistor 24 is of the n-channel type. The gate electrodes of transistors 21 and 24 are connected to an input terminal 10. The input terminal 10 is connectable to receive the logic level signal, $V_{in}$, from a CMOS device, which signal has logic levels that range between −3 volts and 0 volts. The gate electrode of transistor 22 is connected to its drain electrode and to an output terminal 60. The gate electrode of transistor 23 is connected to its drain electrode. The output terminal 60 is connected to a −2 volt DC power source by a termination resistor 62. The output voltage level, $V_{out}$, available on the output terminal 60 will range from −0.88 volts to −1.8 volts.

In the present circuit, the transistors 22 and 23 are operated in their saturation region which causes the transistors to act as diodes. The operation of the remainder of the circuit, for DC operation, is as follows: When the signal $V_{in}$ is −3 volts, the n-channel transistor 24 is turned off and the p-channel transistor 21 is turned on. The voltage on the output terminal 60 charges up to a voltage level of −0.88 volts which is a "HI" level input for ECL logic. When the input voltage $V_{in}$ equals 0 volts, the transistor 21 is turned off and transistor 24 is turned on thereby operating as a complementary switch. The voltage on the output terminal 60 then experiences a discharge to −1.8 volts which is a "LO" level input for ECL logic. This effect is caused somewhat by the body effect of transistor 23. The value of the termination resistor 62 may be 50 to 100 ohms.

Figure 2:
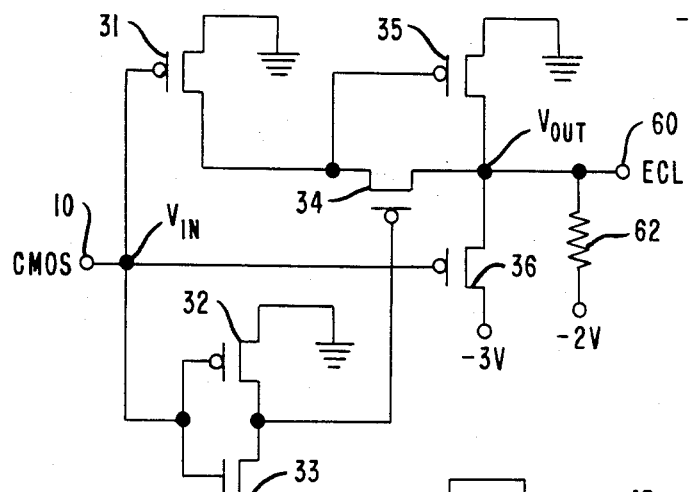
FIG. 2 is a circuit diagram of a second embodiment of the present invention.

Referring now to FIG. 2, wherein a second embodiment of the invention is disclosed, the input terminal 10 receives the CMOS logic level input signal and connects the signal to the gate electrode of the field effect transistors 31, 32, 33 and 36. The source electrode of field effect transistor 31 is connected to a reference potential, such as ground. The drain electrode of transistor 31 is connected to the source electrode of transistor 34 and to the gate electrode of transistor 35. The drain electrode of transistor 34 is connected to an output terminal 60 and to the drain and source electrodes of transistors 35 and 36, respectively. The source electrode of transistor 35 is connected to the reference potential. The drain electrode of transistor 36 is connected to a −3 volt DC power source. The source electrode of transistor 32 is also connected to the reference potential. The drain electrode of transistor 32 is connected to the drain electrode of transistor 33 and to the gate electrode of transistor 34. The source electrode of transistor 33 is connected to the −3 volt DC power source. The output terminal 60 is connected to a −2 volt DC power supply by means of a termination resistor 62.

In operation, when the voltage on the input terminal 10 equals 0 volts, transistors 31, 32 and 36 are turned off. Transistor 33 is turned on, thereby turning on transistors 34 and 35 which in turn pulls the output terminal voltage, $V_{out}$, upwards to −0.88 volts. When the voltage $V_{in}$, on the input terminal, goes to −3 volts, transistor 34 is turned off and transistor 31 is turned on turning off transistor 35, which in turn pulls down the voltage, $V_{out}$, on the source electrode (output terminal 60) of transistor 36 to −1.8 volts. The transistors 35 and 36 operate in complementary fashion to alternately connect the output terminal to either the reference potential (ground) or to the CMOS compatible power supply (−3 volt DC) in response to the CMOS logic level signals coupled from the input terminal by field effect transistors 31–34.

The FIG. 1 and FIG. 2 circuit embodiments are non-inverting, that is, as their input signal goes more positive, the output signal also goes more positive, and conversely, when the input signal goes more negative, the output signal will also go more negative. It is sometimes more preferable to have an inverting type circuit for interfacing two logic levels and such a circuit is disclosed in the FIG. 3 embodiment.

Figure 3:
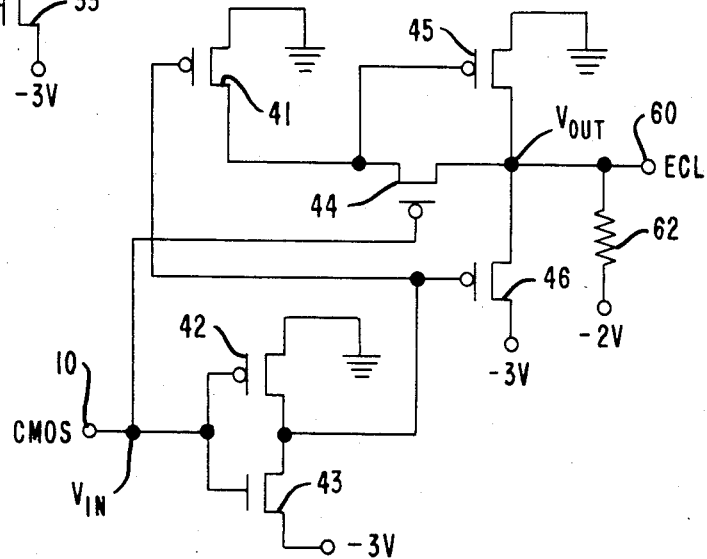
FIG. 3 is a circuit diagram of a third embodiment of the present invention.

Referring now to FIG. 3, the input terminal 10 is coupled to the gate electrode of transistors 42, 43 and 44. The transistor 42 has its source electrode connected to a reference potential, such as ground, and its drain electrode connected to the gate electrode of transistor 41, the gate electrode of transistor 46, and the drain electrode of transistor 43. The source electrode of transistor 43 is connected to a −3 volt DC power source. The source electrodes of transistors 41 and 45 are connected to a reference potential and the drain electrode of transistor 41 is connected to the source electrode of transistor 44 and the gate electrode of transistor 45. The drain electrode of transistor 44 is connected to the drain electrode of transistor 45 and to the source electrode of transistor 46. The drain and source electrodes of transistors 45 and 46, respectively, are connected to the output terminal 60 which in turn is connected to a −2 volt DC power source, by means of a termination resistor 62. The drain electrode of transistor 46 is connected to the −3 volt DC power source.

In operation, when the voltage, $V_{in}$, on the input terminal 10 goes to 0 volts, transistor 42 is turned off and transistor 43 is turned on. When transistor 43 is on, it turns on transistor 46 and turns on transistor 41. Transistor 44, being off, in turn causes transistor 45 to go off. This in turn, lowers the voltage, $V_{out}$, on the output terminal 60 to −1.8 volts. When the voltage on the input terminal 10 goes to −3 volts, transistor 42 is turned on and transistor 43 is turned off. In addition, transistor 44 is turned on. With transistor 43 off, transistor 41 is turned off and transistor 45 is turned on. Transistor 46 tracks transistor 41 and is therefore turned off. With transistor 46 off and transistor 45 on, the voltage, $V_{out}$, on the output terminal 60 rises to approximately −0.88 volts. It can thus be seen that for a 0 volt input there is a −1.8 volt output and for a −3 volt input there is a relatively positive output of −0.88 volts. Therefore, the FIG. 3 circuit embodiment is an inverting circuit.

The circuit embodiments of the present invention provide a novel solution for interfacing CMOS logic level signals to ECL logic level signals while minimizing signal propagation delays and the use of semiconductor area.

We claim:

1. A CMOS to ECL interface circuit comprising:
an input terminal and an output terminal;
a termination resistor for coupling a first power source to said output terminal;
a first, second, and third field effect transistor of first conductivity type, each having gate, source and drain electrodes, the drain and gate electrodes of said second field effect transistor connected to said output terminal;
the source electrode of said first field effect transistor connect able to a reference potential, the drain electrode of said first field effect transistor connected to the source electrode of said second field effect transistor;
a fourth field effect transistor of second conductivity type, having, gate, source and drain electrodes;
the gate electrodes of said first and said fourth field effect transistors connected to said input terminal; and
the drain electrode of said fourth field effect transistor connected to the gate and source electrodes of said third field effect transistor, the source of said fourth field effect transistor connectable to a second power source,
the source electrode of said third field effect transistor is connected to said output terminal.

2. A CMOS to ECL interface circuit comprising:
an input terminal and an output terminal;
a termination resistor for coupling a first power source to said output terminal;
a first, second, fourth, fifth and sixth field effect transistor of a first conductivity type, each having, gate, source and drain electrodes;
a third field effect transistor of second conductivity type, having gate, source and drain electrodes;
said input terminal connected to the gate electrodes of said first, second, third and sixth field effect transistors;
said output terminal connected to the drain electrodes of said fourth and fifth field effect transistors and to the source electrode of said sixth field effect transistor;
the source electrodes of said first, second and fifth field effect transistors coupled to a reference potential;
the source and drain electrodes of said third and said sixth field effect transistors, respectively, coupled to a second power source;

the drain, source and gate electrodes of said first, fourth and fifth field effect transistors, respectively, coupled together; and the drain electrode of said second and third field effect transistors coupled to the gate of said fourth field effect transistor.

3. A CMOS to ECL interface circuit comprising:

an input terminal and an output terminal;

a termination resistor coupled to a first power source and to said output terminal;

first, second, fourth, fifth and sixth field effect transistors of a first conductivity type, each having, gate, source and drain electrodes;

a third field effect transistor of a second conductivity type, having, gate, source and drain electrodes;

said input terminal connected to the gate electrodes of said second, third and fourth field effect transistors;

said output terminal connected to the drain electrodes of said fourth and said fifth field effect transistors, and to the source electrode of said sixth transistor;

the source and the drain electrodes of said third and said sixth field effect transistors, respectively, coupled to a second power source;

the source electrodes of said first, second and fifth field effect transistors coupled to a reference potential;

the drain, source and gate electrodes of said first, fourth and fifth field effect transistors, respectively, coupled together; and the drain electrodes of said second and third field effect transistors coupled to the gate electrode of said first and sixth field effect transistors.

* * * * *